United States Patent [19]

Ohtani et al.

[11] Patent Number: 5,605,846
[45] Date of Patent: *Feb. 25, 1997

[54] METHOD FOR MANUFACTURING SEMICONDUCTOR DEVICE

[75] Inventors: Hisahi Ohtani; Akiharu Miyanaga; Hongyong Zhang; Naoaki Yamaguchi, all of Kanagawa, Japan

[73] Assignee: Semiconductor Energy Laboratory Co., Ltd., Kanagawa, Japan

[ * ] Notice: The term of this patent shall not extend beyond the expiration date of Pat. No. 5,529,937.

[21] Appl. No.: 391,580

[22] Filed: Feb. 21, 1995

[30] Foreign Application Priority Data

Feb. 23, 1994 [JP] Japan ..................................... 6-051237

[51] Int. Cl.$^6$ ........................... H01L 21/268; H01L 21/84
[52] U.S. Cl. ............... 437/21; 437/40; 437/233; 437/174; 148/DIG. 16
[58] Field of Search .................... 437/233, 967, 437/101, 40 GS, 41 GS, 40 TFT, 40 TFI, 41 TFT, 41 TFI, 21, 173, 174, 88; 148/DIG. 16

[56] References Cited

U.S. PATENT DOCUMENTS

| | | | |
|---|---|---|---|
| 3,108,914 | 10/1963 | Moerni | 437/142 |
| 3,791,883 | 2/1974 | Takei et al. | 437/233 |
| 4,309,224 | 1/1982 | Shibata | 148/DIG. 122 |
| 4,502,204 | 3/1985 | Topashi et al. | |
| 4,851,363 | 7/1989 | Troxell et al. | 437/978 |
| 5,075,259 | 12/1991 | Moran | 437/245 |
| 5,108,843 | 4/1992 | Ohtaka et al. | 428/446 |
| 5,147,826 | 9/1992 | Liu et al. | 437/233 |
| 5,244,836 | 9/1993 | Lim | 437/922 |
| 5,275,851 | 1/1994 | Fonash et al. | 437/233 |
| 5,278,093 | 1/1994 | Yonehara | 437/173 |
| 5,289,030 | 2/1994 | Yamazagi et al. | 437/41 TFT |
| 5,387,530 | 2/1995 | Doyle et al. | 437/21 |
| 5,403,772 | 4/1995 | Zhang et al. | 437/233 |
| 5,426,064 | 6/1995 | Zhang et al. | 437/233 |

FOREIGN PATENT DOCUMENTS

| | | | |
|---|---|---|---|
| 56-24925 | 3/1981 | Japan | 437/233 |
| 4-11722 | 1/1992 | Japan | 437/21 |
| 6-3610 | 1/1994 | Japan | 437/41 |

OTHER PUBLICATIONS

C. Hayzelden et al., "In Situ Transmission Electron Microscopy Studies of Silicide–Mediated Crystallization of Amorphous Silicon" Appl. Phys. lett, 60, 2 (1992) 225.

A. V. Dvurechenskii et al., "Transport Phenomena in Amorphous Silicon Doped by Ion Implantation of 3rd Metals", Phys Stat. Sol. A95 (86) 635.

T. Hempel et al., "Needle–Like Crystallization of Ni Doped Amorphous Silicon Thin Films", *Solid State Communications*, vol. 85, No. 11, pp. 921–924, 1993.

Y. Kawazu, et al. Jin. J. Appl. Phys., 29, 12 (1990) 2698 "Low Temperature Crystallization . . . Nickel . . .".

Primary Examiner—Charles L. Bowers, Jr.
Assistant Examiner—Leon Radomsky
Attorney, Agent, or Firm—Sixbey, Friedman, Leedom & Ferguson, PC; Gerald J. Ferguson. Jr.; Jeffrey L. Costellia

[57] ABSTRACT

A process for manufacturing a semiconductor device, particularly a thin film transistor, by using a crystalline silicon film having excellent characteristics. The process comprises forming a silicon nitride film and an amorphous silicon film in contact thereto, introducing a catalyst element capable of promoting the crystallization of the amorphous silicon film by heating the amorphous silicon film, thereby crystallizing at least a part of the amorphous silicon film, and accelerating the crystallization by irradiating the silicon film with a laser beam or intense light equivalent thereto.

26 Claims, 4 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device using a crystalline semiconductor mainly comprising silicon. The silicon semiconductor obtained according to the method of the present invention is suitable for use in thin film transistors, thin film diodes and the like.

2. Prior Art

Thin film transistors utilizing a semiconductor thin film (referred to simply hereinafter as "TFTs") are well known. TFTs are fabricated by forming a thin film semiconductor on a substrate and processing the thin film semiconductor thereafter. TFTs are widely used in various types of integrated circuits, and are particularly suitable in the field of electro-optical devices such as liquid crystal displays; more specifically, as switching elements provided for each of the pixels in an active matrix liquid crystal display device as well as the driver elements of peripheral circuits thereof.

An amorphous silicon film can be utilized most readily as a thin film semiconductor for the TFTs. However, there is a problem in that the electrical characteristics of the amorphous silicon film are poor. The use of a thin film of crystalline silicon can solve this problem. The crystalline silicon film can be prepared by first forming an amorphous silicon film and then heat treating the film to crystallize it. Otherwise, high energy electromagnetic waves for example, a laser beam, can be radiated onto the amorphous silicon film.

The heat treatment for crystallizing amorphous silicon film requires heating the film at a temperature of 600° C. or higher for a duration of 10 hours or longer. Such a high temperature heat treatment is undesirable for a glass substrate. For example, Corning 7059 glass, commonly used for substrates of active matrix liquid crystal display devices, has a glass distortion point of 593° C. and is therefore not suitable for large area substrates that are subjected to heating at a temperature of 600° C. or higher.

According to studies carried out by the inventors of the present invention, it has been found that crystallization of an amorphous silicon film can be effected by heating the film at 600° C. or less, e.g. 550° C. for a duration of about 4 hours. This can be accomplished by first disposing a trace amount of nickel or palladium, or other elements such as lead in contact with the amorphous silicon film and then applying a heat treatment at the above temperature for crystallization.

It has also been known to utilize a laser for crystallization. The silicon film obtained by this method is suitable for use in the fabrication of a TFT since it yields superior characteristics such as high field mobility, low S value, and low threshold voltage. However, the crystallinity of the silicon film thus obtained strongly depends on the energy of the laser. It is therefore apparent that, due to the instability of laser energy, it is very difficult to stably obtain a crystalline silicon film with a high reliability.

Further, in the case of crystallizing an amorphous silicon film with a silicon oxide in contact therewith, the resulting silicon film tends to be oriented along the (111) plane. A TFT having a channel forming region having such a crystal orientation tends to have a threshold voltage $V_{th}$ shifted to a negative value due to the large positive fixed charges. Such TFTs are unfavorable in constituting a complementary circuit composed of an N-channel TFT and a P-channel TFT. Accordingly, in order to control the shift in the threshold voltage, the silicon film must be fabricated with care that it does not orient along the crystallographic (111) plane.

SUMMARY OF THE INVENTION

In view of the above-described circumstances, it is a primary object of the present invention to form a crystalline semiconductor film having a higher electrical characteristics and a higher reliability.

It is another object of the present invention to form a crystalline semiconductor film which is not oriented along the (111) plane.

In accordance with an aspect of the present invention, crystallization of a silicon film is carried out with a silicon nitride film in contact with the silicon film at least partly. The preferred nitrogen/silicon ratio is from 1.3 to 1.5 ($1.3 \leq x \leq 1.5$). If the ratio x is lower than 1.3, the film tends to trap the charge, and is not suitable for a semiconductor device. The electrical characteristics of the film can be improved by adding hydrogen or oxygen at 0.01–2%. In such a case, the silicon nitride film can be expressed by one of the formulas $SiN_xH_y$, $SiO_xN_y$ and $SiO_xN_yH_z$. The silicon nitride film mentioned in this specification includes hydrogenated silicon nitride, and a silicon oxinitride.

The use of a silicon nitride film prevents the silicon film from being oriented along the crystallographic (111) plane. Since crystallized silicon oxide has a diamond structure as a crystal silicon film does, a silicon film crystallized contacting silicon oxide tends to be oriented along the (111) plane due to the boundary energy therebetween. On the other hand, crystallized silicon nitride is cubic, and the matchability with a silicon film is not so good. Thus, by contacting the silicon nitride film, the amorphous silicon film can be crystallized without orienting along the particular plane.

On the other hand, a catalyst element which is capable of promoting the crystallization of the amorphous silicon film is disposed in contact with the silicon film to be crystallized. The catalyst element may be used either in the form of an elemental metal or a compound thereof. Also, it may be shaped into the form of a continuous layer, or a discontinuous layer such as a number of clusters. These will be referred to simply as "a catalyst layer" in the present invention.

The use of nickel as the catalyst element is particularly effective in the process according to the present invention. However, other useful catalyst elements include palladium (Pd), platinum (Pt), copper (Cu), silver (Ag), gold (Au), indium (In), tin (Sn), phosphorus (P), arsenic (As), and antimony (Sb). Otherwise, the catalyst element may be selected from the elements belonging to Groups VIII, IIIb, IVb, and Vb of the periodic table of the former international notation.

The order of the formations of the silicon, silicon nitride, and catalyst layer may be changed arbitrarily. For example:

(1) Forming the layers in the order of silicon nitride film, amorphous silicon film, and catalyst layer;

(2) Forming the layers in the order of silicon nitride film, catalyst layer, and amorphous silicon film;

(3) Forming the layers in the order of catalyst layer, amorphous silicon film, and silicon nitride film; and (4) Forming the layers in the order of amorphous silicon film, catalyst layer, and silicon nitride film; and (5) Forming the catalyst layer on a part of the amorphous silicon film, and a silicon nitride film on the other part of the amorphous silicon film.

In the above examples (1) to (4), the silicon nitride film and the catalyst layer does not need to cover the entire surface of the amorphous silicon film. In the examples (2) and (4), the amorphous silicon film and the silicon nitride film seem to be not in direct contact with each other, however, since the catalyst layer is very thin, the amorphous silicon film is substantially in contact with the silicon nitride.

The amorphous silicon film is subjected to heat treatment thereafter to crystallize the amorphous silicon film at least partly. Amorphous silicon regions may be left in the silicon film after the heating step. That is, crystallization of the silicon film does not need to occur over the entire surface of the amorphous silicon film. Moreover, when the catalyst layer is provided only on a part of the amorphous silicon film, crystallization proceeds from the region covered by the catalyst layer to the periphery thereof.

The crystallization of the silicon film is further progressed by irradiating it with laser beam or intense light beam equivalent thereto. By the irradiation, the amorphous regions and a part of the crystallized regions are melted. However, the other part of the crystallized regions remains without melting. This remaining part of the crystallized regions functions as nuclei and the crystallization proceeds rapidly through the entire region of the silicon film. The degree of crystallization (i.e. the proportion of the area of the crystallized region with respect to the entire area, as observed through a microscope) after heat treatment is in the range of from 20 to 90%. The maximum attainable amount of crystallization is about 97% by raising the heating temperature. However, the proportion of the amorphous component can be more effectively reduced to a negligible degree by irradiation by the above laser beam or intense light beam equivalent thereto.

In a conventional crystallization step using a laser light, the laser irradiation is done onto an amorphous silicon having no nucleating site in order to crystallize through melting. In such a case, the condition for determining crystallinity is very strict, that is, in the absence of nucleating site, it is the cooling rate that mainly determines the crystallinity. However, the cooling rate depends upon the energy density of the laser light or the surrounding temperature. Therefore, the optimum laser energy density is naturally limited to a narrow range. If the energy density is too high, the cooling rate from the melt condition becomes too rapid and leaves an amorphous state in the obtained film. If the energy is too low, the film cannot be wholly melted and leaves amorphous portions also.

In contrast to the above conventional laser process, crystallization in the process according to the present invention can be more readily effected because a crystal nucleus is present, and the crystallization process is less dependent on the cooling rate. Because a large part of the film is crystallized, the film characteristics can be assured to a certain degree even if a low energy density laser is used. Accordingly, in accordance with the present invention, an amorphous silicon film can be uniformly crystallized with a high reliability.

Instead of using a laser beam, non-coherent intense light, particularly infrared radiation, may be used. The majority of infrared radiation is not absorbed by glass, but is readily absorbed by thin film silicon. Accordingly, thin film silicon can be heated selectively without heating the glass substrate by the use of IR light. This process of radiating infrared light for a short period of time is called as rapid thermal annealing (RTA) or a rapid thermal process (RTP).

DETAILED DESCRIPTION OF THE INVENTION

Figure 1A:
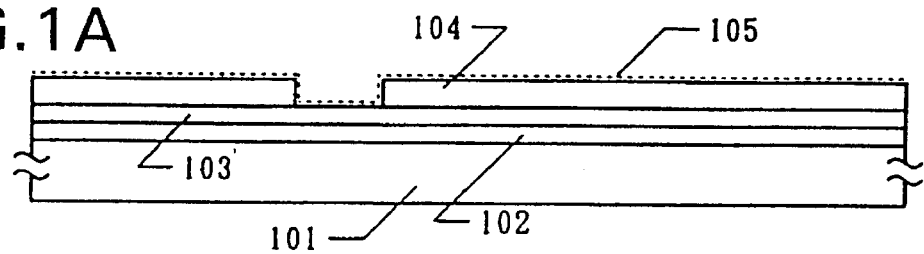
FIGS. 1A to 1F shows a manufacturing step of a semiconductor device in accordance with the first embodiment of the present invention.

The present invention is described in further detail below, referring to preferred embodiments. It should be understood, however, that the present invention is not to be construed as being limited to the examples below.

The catalyst element can be incorporated into the film by a deposition process, such as sputtering of the catalyst element or a compound of the element, using a vacuum deposition apparatus. In an alternative, a deposition process can be effected in the atmosphere by coating the surface of the amorphous silicon film with a solution containing the catalyst element. The latter process is particularly advantageous in terms of the reproducibility of the process and the equipment expenses.

The solution for use in the process may be an aqueous solution or a solution based on an organic solvent or the like. The "solution" referred to herein encompasses those solutions containing the catalyst element in the form of a compound dissolved in the solution and those containing the element in dispersed form.

The solvent containing the catalyst element may be selected from various types of polar solvents such as water, alcohol, acid, or ammonia water.

When nickel is used as the catalyst, it may be added to the polar solvent in the form of a nickel compound. More specifically, it may be selected from a group of nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

Otherwise, a non-polar solvent can be used in the solution containing the catalyst element. For example, a solvent selected from benzene, toluene, xylene, carbon tetrachloride, chloroform, and ether. In this case again, nickel is incorporated in the solution in the form of a nickel compound. Typical compounds to be mentioned include nickel acetylacetonate and nickel 2-ethylhexanoate.

It is also useful to add a surface active agent (surfactant) to the solution containing the catalyst element. The surfactant increases the adhesive strength of the solution and controls adsorption. The surfactant may be applied previously to the surface of the substrate onto which the amorphous silicon is deposited.

When metallic nickel is used as the catalyst, it must be dissolved in an acid to provide a solution.

The description above is for a case where the catalyst is completely dissolved in a solution. However, the catalyst does not need to be completely dissolved in the solution, and other materials, such as an emulsion in which catalyst metal or a catalyst compound is dispersed in the form of a powder in a dispersant. It is also possible to use a solution which is available as a material for forming an oxide film. A preferred example of the solution is OCD (Ohka Diffusion Source) manufactured by Tokyo Ohka Kogyo Co., Ltd. A silicon oxide film can be easily obtained by applying the OCD to the desired surface, and baking it at about 200° C. Since an impurity can be readily added to the solution, the OCD can be utilized in the process of the present invention.

Although the concentration of the catalyst element in the solution depends on the kind of the solution, roughly speaking, the concentration of nickel by weight is from 0.1 to 200 ppm, and preferably from 1 to 50 ppm or lower. The concentration is determined based on the nickel concentration in or the resistance against hydrofluoric acid of the crystallized film.

Crystal growth can be controlled by applying the solution containing the catalyst element to selected portions of the amorphous silicon film. In particular, crystals can be grown in parallel with the plane of the silicon film from the region onto which the solution is applied to the region onto which the solution is not applied. The region in which the crystals are grown in parallel with the plane of the amorphous silicon film is referred to hereinafter as a lateral growth region.

It is confirmed that the lateral growth region contains the catalyst element at a lower concentration. Although it is useful to utilize a crystalline silicon film as an active layer region for a semiconductor device, in general, the concentration of the impurity in the active region as low as possible. Accordingly, it is advantageous to employ the lateral growth region as an active region of a semiconductor device.

EXAMPLE 1

The present example refers to a process for fabricating a crystalline silicon film on the surface of a glass substrate. Referring to FIGS. 1A–1F, a Corning 7059 glass substrate 100 mm×100 mm in size and 1.1 mm in thickness was prepared. A silicon nitride film from 1,000 to 5,000 Å, for example, 2000 Å thickness was deposited as a base film 102 by sputtering or plasma CVD on the substrate 101. The stoichiometric ratio of nitrogen and silicon (nitrogen/silicon) was set to 1.3 to 1.35, preferably 1.32 to 1.34.

The silicon nitride film is formed, for example, by a plasma CVD with the following conditions:

RF power: 13.56 MHz, 300 W

Substrate Temperature: 300 ° C.

$SiH_4/NH_3$=30 sccm/210 sccm

Pressure: 0.3 Torr

Generally, when the temperature is higher, the concentration of hydrogen in the obtained film is reduced.

Then, an amorphous silicon film 103 was deposited to a thickness of 100 to 1,500 Å, for example, 800 Å by plasma CVD or LPCVD.

A silicon oxide film 104 was formed to a thickness of 500 to 3,000 Å, for example, 1,000 Å. Holes were perforated selectively in the resulting silicon oxide film to expose the underlying amorphous silicon film as shown in FIG. 1A.

The resulting amorphous silicon film was immersed in an aqueous hydrogen peroxide solution to form an extremely thin silicon oxide film (not shown in the figure) on the exposed portions of the amorphous silicon film. The thickness of the silicon oxide film is 10 to 100 Å. However, due to its extreme thinness, the accurate thickness of the film was unknown. Alternatively, the thin oxide film may be formed through an ultraviolet (UV) light irradiation in an oxygen atmosphere. In this case, the surface may be exposed to a UV light in an oxygen atmosphere for 1 to 15 minutes. It is also possible to employ thermal oxidation.

The oxide film was provided with the purpose of spreading the acetate solution containing nickel, which is to be applied in a later step, over the entire surface of the amorphous silicon film uniformly. That is, the oxide film was provided for improving the wettability of the amorphous silicon film. If the aqueous acetate solution were to be applied directly onto the surface of the amorphous silicon film, the solution tends to be repelled so that the nickel can not be uniformly formed on the silicon film, resulting in that the uniformity of the crystallinity would be hindered. This problem can be solved by the provision of the thin oxide film.

Next, an aqueous acetate solution containing nickel at a concentration of 100 ppm was prepared. Two milliliters of the acetate solution was dropped onto the surface of the oxide film on the amorphous silicon film and maintained as it is for a duration of 5 minutes. Spin drying at 2,000 rpm was effected for 60 seconds thereafter.

The amorphous silicon film coated with the solution above was kept as it is for a duration of 1 to 10 minutes thereafter. Although the final concentration of nickel in the silicon film can be controlled by changing this duration, the most influential factor in controlling the nickel concentration was the concentration of the solution.

This step of applying the nickel solution was repeated one to several times, whereby a nickel-containing layer (catalyst layer) 105 having a thickness of from several Å to several hundred Å was obtained on the exposed surface of the amorphous silicon film 103 after spin drying. The nickel in the layer will diffuse into the amorphous silicon film during a heat treatment and will functions as a catalyst for promoting crystallization.

Figure 1B:
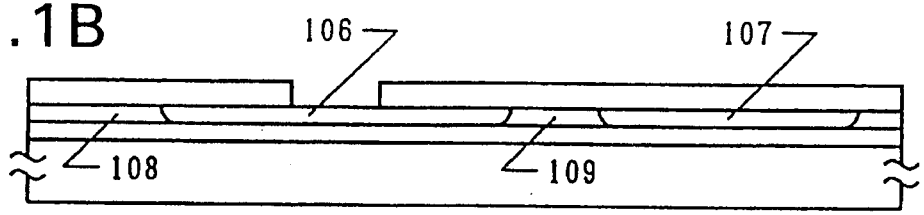

The silicon film coated with nickel-containing solution thus obtained was subjected to a heat treatment at a temperature of 550° to 600° C., e.g. 550 ° C. for a duration of 1 to 12 hours, e.g. 8 hours in a nitrogen atmosphere using a furnace. As a result, crystallization proceeded from the opening in the silicon oxide film 104 to form the crystallized regions 106 and 107 as shown in FIG. 1B. The other regions 108 and 109 remained in an amorphous state.

Figure 2A:
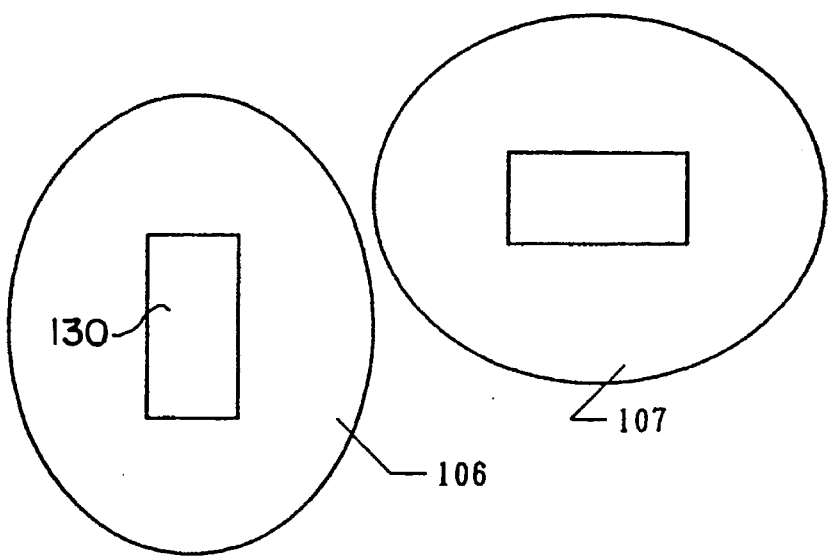
FIGS. 2A to 2C are plane views corresponding to the structures shown in FIGS. 1A–1F.

A plane view of the structure of FIG. 1B is shown in FIG. 2A. It can be seen that the crystallized region extends from the opening region 130 to an oval region.

Figure 1C:
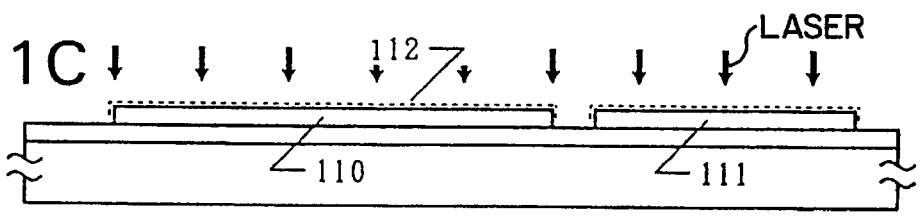

Then, the silicon oxide film 104 was etched. And also, the silicon film 103 is patterned into island regions 110 and 111. The etching of the silicon film was performed by means of an RIE (reactive ion etching) method which is perpendicularly anisotropic. The island regions 110 and 111 will be an active region of TFTs. A very thin silicon oxide film 112 was then formed to a thickness of 100Å or less on the surface of the silicon islands 110 and 111 by a heat treatment in an oxygen atmosphere at 550° C. as shown in FIG. 1C.

Next, the crystallinity of the island-like regions 110 and 111 was further improved by laser beam irradiation using a KrF excimer laser operated at a wavelength of 248 nm and with a pulse width of 30 nsec. The laser was operated to provide several shots per site with an energy density of from 200 to 400 $mJ/cm^2$, for example, 300 $mJ/cm^2$, in a nitrogen atmosphere or in the air. Instead of using a KrF excimer laser, other types of excimer lasers such as an XeCl laser (wavelength of 308 nm), an ArF laser (193 nm), or an XeF laser (353 nm) may be used. Also, a rapid thermal annealing (RTA) process may be employed.

Figure 1D:
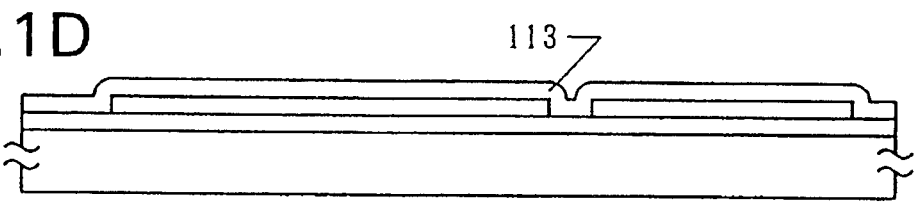

Referring to FIG. 1D, a 1,000 Å thick silicon oxide film 113 was deposited after the laser irradiation as a gate insulating film by sputtering or by plasma CVD. When sputtering is employed, silicon oxide is used as a target, the substrate temperature is in the range of from 200° to 400° C., for example at 350° C., and the sputtering gas comprises a mixture of oxygen and argon at an argon to oxygen ratio ($Ar/O_2$) of 0 to 0.5, preferably, 0.1 or less.

Figure 1E:
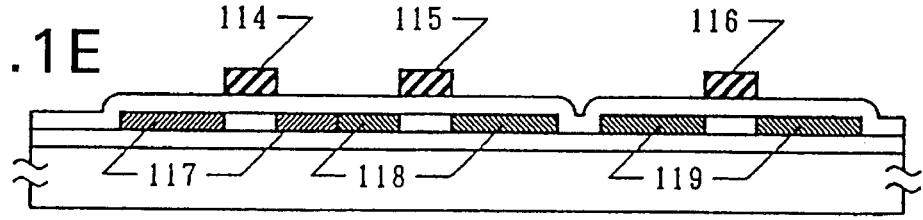
Figure 2B:
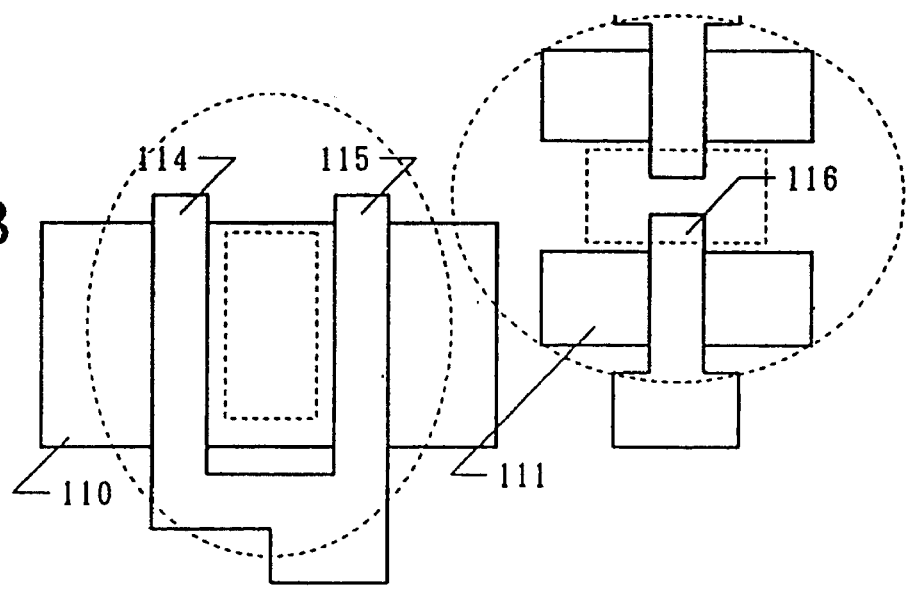

Subsequently, a silicon layer containing phosphorus at 0.1–2% was deposited to a thickness of 3,000 to 8,000 Å, for example, 6000 Å, through reduced pressure CVD. It is desirable to form the silicon film successively following the formation of the silicon dioxide film 113. The silicon film was then patterned to provide gate electrodes 114 to 116 as shown in FIG. 1E. A planar view corresponding to FIG. 1E is shown in FIG. 2B. The oval area defined by the broken lines corresponds to the regions 106 and 107 shown in FIG. 2A.

Then, by means of ion doping, phosphorus and boron were implanted as impurities into the active layer using the gate electrodes 114 to 116 as masks. In the present example, phosphine ($PH_3$) was used as the doping gas to implant phosphorus, and diborane ($B_2H_6$) was used for the implantation of boron. In implanting phosphorus, an acceleration voltage of 60 to 90 kV, for example 80 kV, was applied, and in implanting boron, an accelerating voltage of 40 to 80 kV, e.g. 65 kV, was applied. The dose amount was in the range of from $1\times10^{14}$ to $8\times10^{15}$ $cm^{-2}$, for example, phosphorus was implanted at a dose of $1\times10^{15}$ $cm^{-2}$, and boron was implanted at a dose of $2\times10^{15}$ $cm^{-2}$. The elements were each selectively doped by covering the unnecessary portions with a photoresist. Thus were obtained N-type impurity regions 118 and 119, and P-type impurity regions 117.

The ion-implanted impurities were activated thereafter by laser annealing. Annealing was performed by a laser beam, for example, using a KrF excimer laser (wavelength of 248 nm and a pulse width of 20 nsec). The condition of the laser irradiation was 2 to 10 shots per site, for example, 2 shots per site, at an energy density of 200 to 400 $mJ/cm^2$, for example 250 $mJ/cm^2$. Furthermore, it was possible to improve the uniformity in resistance if the substrate was heated at 200°–450° C. during the laser irradiation. Because nickel was diffused among the previously crystallized region, the recrystallization is easily proceeded by the laser irradiation and the P-type regions 117 doped with a P-type impurity and N-type regions 118 and 119 doped with an N-type impurity were effectively activated. It is possible to use other light sources as mentioned before.

Figure 1F:
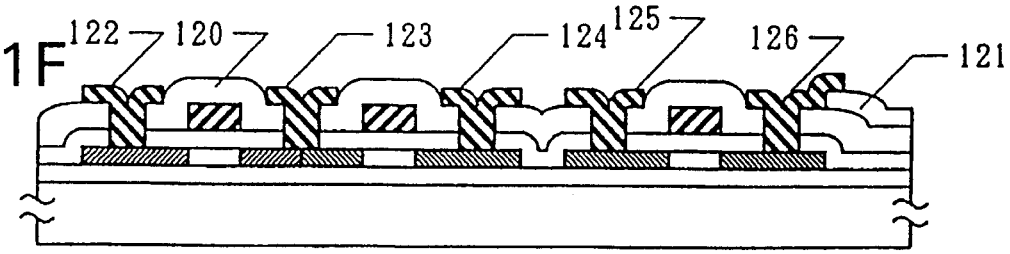
Figure 2C:
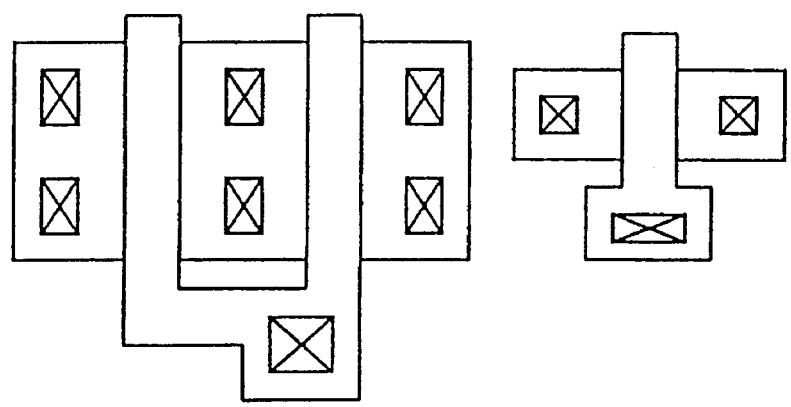

Referring to FIG. 1F, a 6,000 Å thick silicon oxide film 120 was deposited by plasma CVD as an interlayer dielectric. Further, a 500 Å thick ITO film was deposited by sputtering, and patterned to provide a pixel electrode 121. Contact holes were formed as shown in FIG. 2C, and electrodes with interconnections 122 to 126 for the TFT were formed using a metallic material, for example, a multilayered film of titanium nitride and aluminum. Finally, the resulting structure was annealed in a hydrogen atmosphere at 1 atom and 350° C. for 30 minutes. Alternatively, instead of effecting hydrogen annealing, hydrogen ions may be accelerated with an acceleration voltage of 10 to 100 keV and implanted into the active layer, followed by annealing. This step may be done during the steps shown in FIG. 1C or FIG. 1D.

A circuit comprising TFTs was thus obtained. For example, a so-called monolithic active matrix circuit, i.e. an integrated circuit having an active matrix circuit and the logic circuit for driving the active matrix circuit on the same substrate can be formed, more specifically, the N-channel TFT and the P-channel TFT associated with the island-like region 110 are arranged in a complementary form to serve mainly as the logic circuit, and the TFT formed in the silicon island 111 is used as a switching transistor in an active matrix circuit.

As is apparent from FIG. 2B, the channel region of the TFT according to the present example was provided in the lateral growth region of the regions 106 and 107. The lateral growth region yields excellent crystallinity, and hence, the electrical characteristics such as threshold voltage, field-effect mobility and the like could be improved. On the other hand, the region into which nickel was directly incorporated contained a higher concentration of nickel, and also the regions 108 and 109 have a poorer crystallinity. Hence, it is not preferable to form a channel region in these regions. However, the source, drain, etc. may be formed therein.

EXAMPLE 2

The process for fabricating a semiconductor device according to the present example will be described below with reference to FIGS. 3A to 3F. A silicon oxide film 202 was deposited by a known method such as plasma CVD to a thickness of 1,000 to 5,000 Å, for example, 2000 Å as a base film on a Corning 7059 glass substrate 201 (10 cm×10 cm in size). An amorphous silicon film 203 was deposited by plasma CVD or reduced pressure CVD to a thickness of 1,000 Å.

Figure 3A:
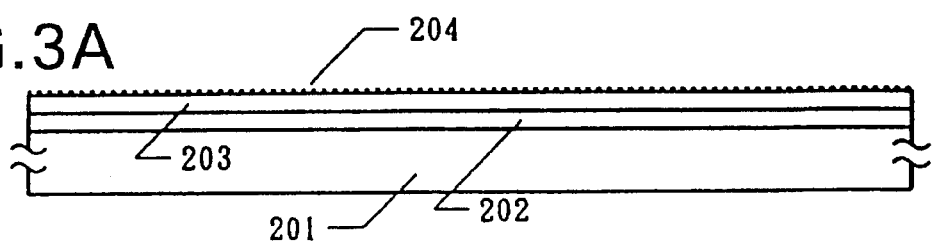
FIGS. 3A to 3F are diagrams showing a manufacturing step of a semiconductor device in accordance with the second embodiment of the present invention.

After forming an ultra-thin silicon oxide film (not shown) on the surface of the amorphous silicon film using aqueous hydrogen peroxide, 5 ml of an acetate solution containing 25 ppm of nickel was dropped onto the oxidized surface of the amorphous silicon film in the same manner as in Example 1. Further, at this time, spin-coating was effected at 50 rpm for a duration of 10 seconds to form a uniform aqueous film over the entire surface of the substrate. After further retaining this state for a duration of 5 minutes, spin-drying was effected for a duration of 60 seconds at 2,000 rpm using a spinner. The substrate may be retained with being rotated by the spinner at 150 rpm or less. A catalyst layer 204 containing nickel was formed in this manner as shown in FIG. 3A.

Figure 3B:
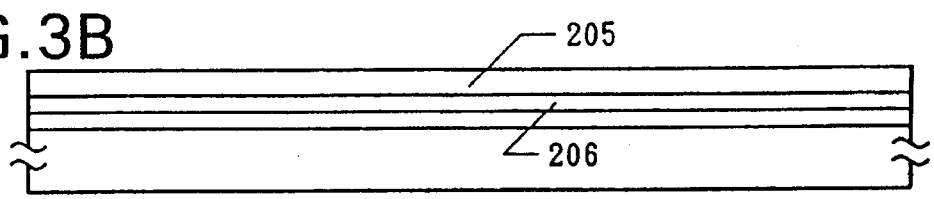

Referring to FIG. 3B, a silicon nitride film 205 was deposited thereafter to a thickness of 500 to 3,000 Å, e.g. 1000 Å, through plasma CVD in the same manner as in Example 1. Then, the amorphous silicon film 203 was crystallized by a heat treatment in a nitrogen atmosphere at a temperature of 550° C. for a duration of 4 hours. Since the nickel is formed between the amorphous silicon film 203 and the silicon nitride film 204, crystallization proceeded downwardly through the amorphous silicon film from the upper portion thereof.

Figure 3C:
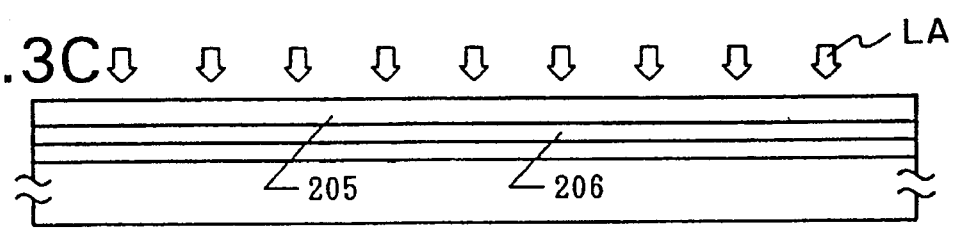

After the above crystallization step was performed by the heat treatment, the crystallinity of the silicon film 12 was further improved by the use of an XeCl laser (a wavelength of 308 nm) through the silicon nitride film 205 as shown in FIG. 3C. It was effective to heat the substrate or the laser irradiated surface by using an additional heat source during the laser irradiation in order to obtain a more uniform crystallinity and lower the necessary laser energy. The preferable temperature range was 200°–450° C. As a result, the amorphous component in the silicon film can be completely crystallized.

This step can be effected by an RTA instead of a laser irradiation. More specifically, infrared radiation of 0.6 to 4 μm wavelength, more specifically, an infrared radiation having a peak in the range of from 0.8 to 1.4 μm, was emitted for a duration of 30 to 180 seconds. Furthermore, hydrogen chloride may be included in the atmosphere at 0.1–10%.

A halogen lamp was used as the light source of the IR light. The intensity of the infrared radiation was controlled in such a manner that the temperature as measured on a single crystal silicon wafer used as a monitor is maintained within a range of 900° to 1,200° C. More specifically, the temperature detected by a thermocouple buried inside the silicon wafer was monitored, and the result was fed back to the infrared light source. In the present example, the temperature was raised at a constant rate of 50° to 200° C./second, and cooling was effected by natural cooling at a rate of 20° to 100° C./second. The substrate may be exposed to the IR light with the substrate temperature at a room temperature, however, the substrate is preferably heated previously to 200° to 450° C., for example 400° C.

Then, the silicon nitride film 205 was removed, and the silicon film 203 was patterned to form island regions 207 and 208 by a reactive ion etching (RIE).

Figure 3D:
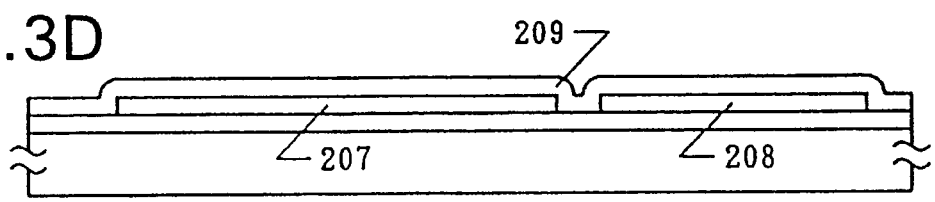

Referring to FIG. 3D, a 1,000 Å, thick silicon oxide film 209 was deposited thereafter through a plasma CVD using TEOS (tetraethoxysilane) and oxygen as the starting materials for forming a gate insulating film. The temperature of the substrate during film deposition was 200° to 400° C., for example 350° C. Also, trichloroethylene (TCE) was added to the TEOS at an amount of 1 to 50%, typically 20%. Chlorine is introduced into the gate insulating film by the addition of the trichloroethylene so that mobile ions (such as sodium) can be removed from the active layer so as to improve an electrical characteristics of the device. Furthermore, the structure may be thermally annealed thereafter at a temperature of 550° to 600° C. in a nitrogen atmosphere or a dinitrogen monoxide atmosphere.

Figure 3E:
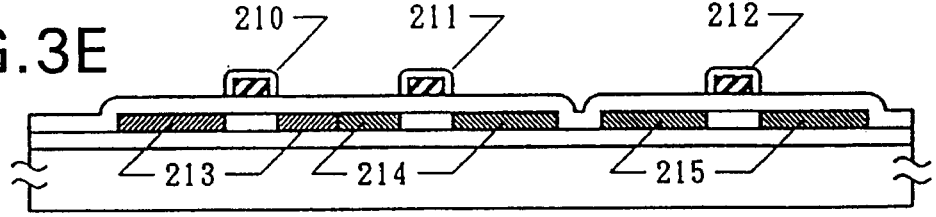

Subsequently, an aluminum film containing scandium at 0.1–2% was deposited by sputtering to a thickness of 3,000 to 8,000 Å, for example, 4,000 Å. The aluminum film was patterned thereafter to provide gate electrodes 210 to 212 as shown in FIG. 3E. The gate electrodes thus obtained were anodically oxidized thereafter by applying a current thereto in an electrolytic solution to form oxide films to a thickness of 1,000 to 3,000 Å, e.g. 2000 Å on the upper and side surfaces of the gate electrode. The ethylene glycol solution contains a tartaric acid at 1–5%. The thickness of the anodic oxide layer formed in this step approximately corresponds to the thickness of an offset region which is to be formed in the subsequent impurity doping step. Accordingly, the anodic oxidation process controls the formation of an offset region.

Next, P or N-type impurities were added to the semiconductor layer in a self-alignment manner by means of ion doping (also called as plasma doping) utilizing the gate electrode portion (i.e. the gate electrode and surrounding oxide layer) as a mask. In the present example, phosphine ($PH_3$) was used as the doping gas to implant phosphorus, and diborane ($B_2H_6$) was used for the implantation of boron. In implanting phosphorus, an acceleration voltage of from 60 to 90 kV, for example 80 kV, was applied, and in implanting boron, an acceleration voltage of from 40 to 80 kV, e.g. 65 kV, was applied. The dose was in the range of from $1\times10^{15}$ to $8\times10^{15}$ $cm^{-2}$. For example, phosphorus was implanted at a dose of $5\times10^{15}$ $cm^{-2}$, and boron was implanted at a dose of $2\times10^{15}$ $cm^{-2}$. The impurities were each selectively added by covering the unnecessary portions of the silicon films with a photoresist. Thus, N-type impurity regions 214 and 215, and P-type impurity region 213 were obtained to provide a P-channel type TFT (PTFT) region and a N-channel type TFT (NTFT) region.

The ion-implanted impurities were activated in the same manner as in Example 1.

Figure 3F:
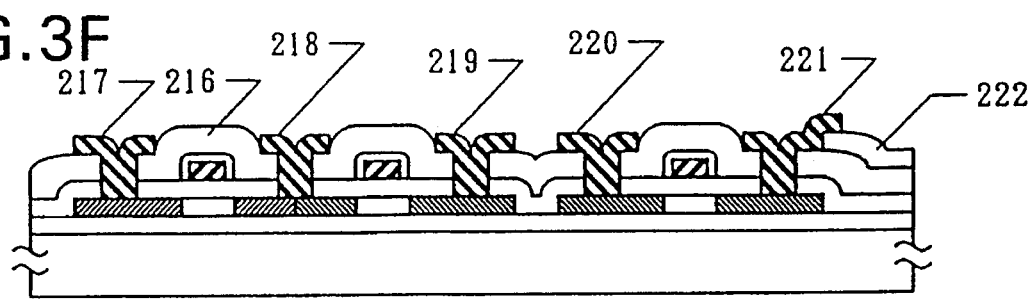

Referring to FIG. 3F, a 6,000 Å thick silicon oxide film 216 was deposited by plasma CVD as an interlayer dielectric. Then, a 500 Å thick ITO film was deposited by sputtering and patterned to provide a pixel electrode 222. Contact holes were formed in the interlayer dielectric 216, and electrodes 217 to 221 were formed by using a metallic material, for example a multilayered film of titanium nitride and aluminum. Finally, the resulting structure was annealed in a hydrogen atmosphere at a pressure of 1 atom and a temperature of 350° C. for 30 minutes.

EXAMPLE 3

A process for fabricating a semiconductor device according to a third example will be described below with reference to FIGS. 4A to 4F. A silicon oxide film 302 was deposited through plasma CVD to a thickness of 2,000 Å as a base film on an NH 35 glass substrate 301 (NH Technoglass Co., Ltd.). After depositing the base film, the structure was annealed in a temperature range of from 620° to 660° C. for a duration of from 1 to 4 hours, and was gradually cooled at a rate of 0.1 to 1.0° C./minute, preferably from 0.1° to 0.3° C./minute. The substrate was taken out when the temperature was cooled to 450°–590° C.

An amorphous silicon film 303 was deposited by plasma CVD to a thickness of 300 to 1,200 Å, e.g. 500 Å. Then, a nickel acetate layer of 20 to 50 Å thick was formed by spin coating in the same manner as the foregoing Examples 1 and 2, using a mask 304 made of a silicon nitride film of 1,000 to 3,000 Å thick, e.g. 2,000 Å. As described in Example 1, it was necessary to form a very thin silicon oxide film on the surface of the exposed region of the amorphous silicon film.

Figure 4A:
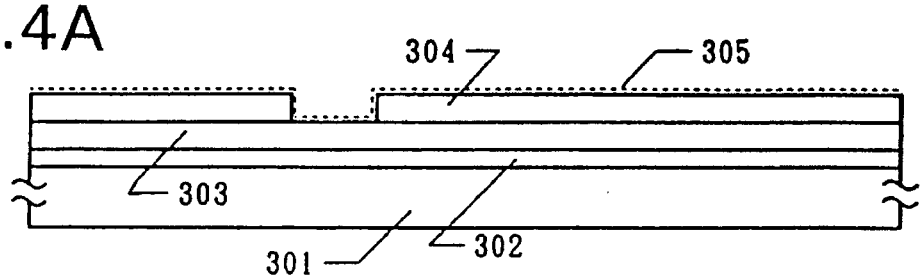
FIGS. 4 (A) to 4 F are diagrams showing a manufacturing step of a semiconductor device in accordance with the third embodiment of the present invention.
Figure 4B:
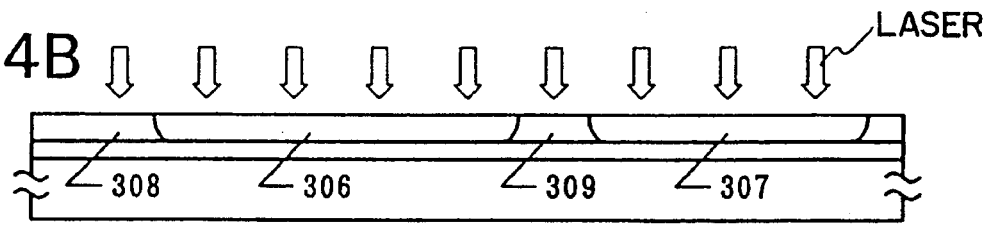

The resulting structure was annealed at 600° C. for a duration of 4 hours in a nitrogen atmosphere to crystallize the silicon film 303. Similar to the case of Example 1, crystallization was found to initiate from the region in which nickel and the silicon film were brought into contact and proceed in transversely therefrom. Referring to FIG. 4B, the regions 306 and 307 correspond to the crystallized regions obtained in the present step, and the regions 308 and 309 were found to remain as they were in the form of amorphous silicon.

After completion of the heat treatment, the silicon nitride film 304 provided as the mask was removed. The crystallinity of the silicon film 303 was further improved by an irradiation with a KrF excimer laser as shown in FIG. 4B.

Figure 4C:
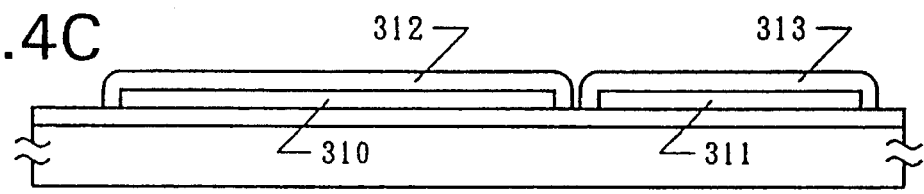

The silicon film 303 was then patterned to provide island-like active layer regions 310 and 311 as shown in FIG. 4C. The active layer was etched using a perpendicularly anisotropic RIE method.

The surface of the active layer was oxidized to a thickness of 200 to 800 Å, typically 500 Å by exposing it to an 1 atm oxygen atmosphere containing 10% water vapor for 3 to 5 hour at 550°–600° C. As a result, silicon oxide films 312 and 313 were formed. The silicon oxide films, which were advantageous from the viewpoint of controllability of film thickness, were formed through a pyrogenic oxidation method using a mixed gas containing hydrogen and oxygen at a volume ratio of 1.8:1.0 to 1.0:1.0. The thickness of the silicon oxide films 312 and 313 thus obtained were 400 to 1,600 Å, for example, 1,000 Å. Hydrogen incorporated inside the silicon oxide film was removed by annealing the silicon oxide film at 600° C. in a dinitrogen monoxide atmosphere at 1 atm for 1 hour.

Subsequently, an aluminum film containing from 0.1 to 2% of scandium was deposited to a thickness of 3,000 to 8,000 Å by sputtering, for example 5,000 Å. The aluminum film was patterned thereafter to provide gate electrodes. The gate electrodes thus obtained were anodically oxidized in the same manner as in Example 2, by applying a current thereto in an electrolytic solution to form oxide films 1,000 to 3,000 Å thickness, e.g. 2,000 Å thick on the upper and side surfaces of the gate electrodes. Thus, gate portions 314, 315, 316 including the anodic oxides are formed.

Impurities for imparting either P- or N-conductivity to the active layer region were added in a self-alignment manner by means of ion doping (plasma doping) utilizing the gate portions as a mask. The doping conditions were entirely the same as those in the previous examples. Thus, N-type impurity regions 318 and 319, and P-type impurity regions 317 were formed to provide a P-channel TFT (PTFT) region and N-channel TFT (NTFT) regions.

The ion-implanted impurities were thereafter activated by laser annealing using a KrF excimer laser (a wavelength of 248 nm and a pulse width of 20 nsec).

Figure 4D:
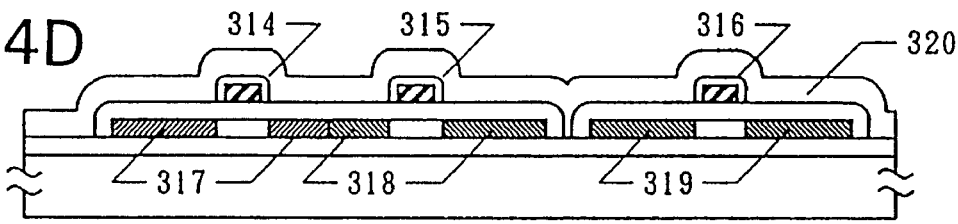

Then, a silicon oxide film 320 was deposited by plasma CVD to a thickness of 0.5 to 1μm, for example 0.7 mm as shown in FIG. 4D. This film must exhibit excellent coverage on the side surfaces of the gate electrode.

Figure 4E:
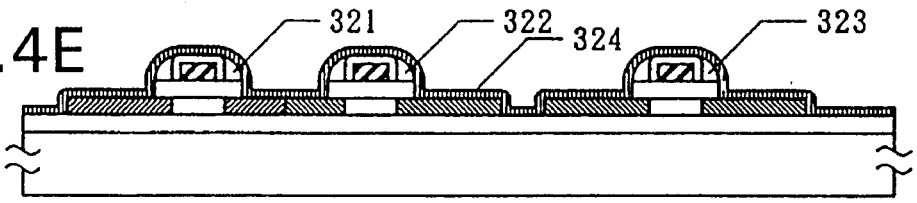
Figure 4F:
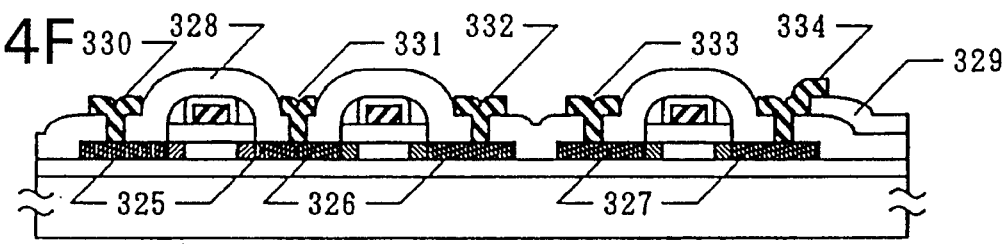

The insulating coating thus obtained was anisotropically etched by means of dry etching and the like. More specifically, etching was performed selectively along the perpendicular direction. As a result, the surface of the source/drain regions was exposed, while leaving approximately triangular insulators 321, 322, and 323 on the sides of the gate portions 314–316 as shown in FIG. 4E.

The size, particularly the width, of the approximately triangular insulators 321 to 323 depends on the thickness of the previously deposited silicon oxide film 320, etching conditions, and the height of the gate portions. The insulators 321 to 323 thus obtained are not necessarily in a triangular shape, but in any shape depending on the step coverage and the film thickness of the silicon oxide film 320. For example, rectangular insulators were formed if the thickness is small. A titanium film 324 was then formed at a thickness of 5 to 50 nm by means of sputtering. Materials other than titanium, such as molybdenum, tungsten, platinum, or palladium, could also be used. The film thus deposited was annealed at a temperature of 200° to 650° C., preferably 400° to 500° C., to allow the titanium film to react with silicon constituting the source/drain regions. Silicide layers 325, 326, and 327 were formed in this manner on the source/drain regions.

The non-reacted titanium film remaining principally on the silicon oxide or on the anodically oxidized film was etched thereafter. A silicon oxide film was deposited to a thickness of 6000 Å as an interlayer dielectric 328 over the entire surface by a CVD. Further, an ITO film was deposited by sputtering to a thickness of 500 to 1,000 Å, and was patterned to provide a pixel electrode 329. Then, as shown in FIG. 4 F, contact holes were formed in the source/drain of the TFT, following which a multilayered film of titanium nitride and aluminum were formed to form electrode/wiring 330–334. The thickness of the titanium nitride layer is 800 Å and that of aluminum layer is 5,000 Å. Finally, the resulting structure was annealed in a hydrogen atmosphere at 1 atm at 350° C. for 30 minutes to complete a TFT circuit.

As described in the foregoing, the present invention provides a silicon film having excellent crystallinity. The crystalline silicon film thus obtained according to the present invention is suitable for use in the fabrication of a TFT as shown in the examples. For example, an N-channel type TFT (i.e. a TFT comprising an N-type conductive source and drain) fabricated by using a crystalline silicon produced by a conventional SPC (solid phase crystallization) process yields a field effect mobility μ in the range of 50 to 60 $cm^2/Vs$ at best. This can be improved to a range of 90 to 100 $cm^2/Vs$ by adding a catalyst element such as nickel and thereby promoting the growth in the lateral direction. Still, however, this value was in clear contrast with the mobility μ obtained in the device fabricated according to the present invention. For example, the device obtained in Example 3 according to the present invention yields a mobility μ in the range of 150 to 200 $cm^2/Vs$.

Furthermore, concerning the threshold voltage, a value in the range of 0 to 1 V was obtained in the device fabricated according to the present invention. Considering that devices obtained by conventional processes yield threshold voltages in the range of from +3 to +7 V, this characteristic of the device according to the present invention is far superior to those of prior art TFTs. The improvement in the threshold voltage is particularly remarkable in a P-channel TFT, in which the absolute value of the threshold value is found to drop from the conventional range of from 6 to 10 V to a range of from 0 to 2 V. These effects result from the fact that the silicon films are formed without being oriented along the crystallographic (111) plane, because the amorphous silicon film is crystallized with silicon nitride in contact therewith. Thus, in case of fabricating a complementary circuit by combining an N-channel TFT with a P-channel TFT, the circuit can be driven at a lower voltage because the difference in threshold voltage in each of the TFTs can be reduced. Thus, a far more reliable circuit can be implemented. It can be seen from the foregoing that the present invention is industrially contributory in various aspects.

While the invention has been described in detail and with reference to specific embodiments thereof, it will be apparent to one skilled in the art that various changes and modifications can be made therein without departing from the spirit and scope thereof. For example, while nickel was used in the preferred embodiments of the invention, it is to be understood that any catalyst material other than nickel may be used. Further, the present invention is applicable to a bottom gate type TFT in which a crystalline active semiconductor layer is located over a gate electrode.

What is claimed is:

1. A method of manufacturing a semiconductor device over a substrate comprising the steps of:

forming a base insulating film on said substrate;

forming a semiconductor film comprising silicon on said base insulating film in direct contact therewith;

disposing a catalyst capable of promoting a crystallization of an amorphous silicon on at least a portion of said semiconductor film;

heating said semiconductor film in order to crystallize said semiconductor film to a degree of crystallization in the range of 20 to 90%; and then irradiating said semiconductor film with light in order to further improve the crystallinity of said semiconductor film.

2. The method of claim 1 wherein said light is emitted from a laser or a flash lamp.

3. The method of claim 1 wherein said catalyst comprises an element or a compound thereof, said element selected from the group consisting of nickel, palladium, platinum, copper, silver, gold, indium, tin, phosphorus, arsenic, and antimony.

4. The method of claim 1 wherein said catalyst comprises an element or a compound thereof, said element selected from the Group VIII, IIIb, IVb, and Vb of the periodic table.

5. The method of claim 1 wherein said catalyst is introduced into said semiconductor film by a method comprising:

preparing a solution in which said catalyst is dissolved or dispersed in a polar solvent; and disposing said liquid substantially in contact with said semiconductor film.

6. The method of claim 5 wherein said polar solvent is at least one selected from a group consisting of water, alcohol, acid, and ammonia water.

7. The method of claim 5 wherein said catalyst comprises a nickel compound.

8. The method of claim 7 wherein said nickel compound is at least one selected from a group consisting of nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

9. The method of claim 1 wherein said base insulating film comprises silicon nitride.

10. The method of claim 1 wherein said degree of cyrstallization is a proportion of area of a part crystallized of said semiconductor film with respect to an entire area of said semiconductor film.

11. A method of manufacturing a semiconductor device comprising the steps of:

preparing a substrate having an insulating surface;

forming an amorphous semiconductor film comprising silicon on said insulating surface;

preparing a solution containing a catalyst therein which is capable of promoting a crystallization of said semiconductor film;

applying said solution on at least a portion of said semiconductor film;

forming a cover film on said semiconductor film after applying said solution on the semiconductor film; then applying a heat energy to said semiconductor film in order to crystallize said semiconductor film to a degree of crystallization in the range of 20 to 90%, and irradiating said semiconductor film with light in order to further improve the crystallinity of said semiconductor film.

12. The method of claim 11 wherein said catalyst comprises a metal or a metal compound.

13. The method of claim 11 wherein said cover film comprises silicon nitride.

14. The method of claim 11 wherein said degree of crystallization is a proportion of area of a part crystallized of said semiconductor film with respect to an entire area of said semiconductor film.

15. A method of manufacturing a semiconductor device over a substrate comprising the steps of:

preparing said substrate having an insulating surface;

forming a base film comprising silicon nitride on said insulating surface;

preparing a solution containing a catalyst capable of promoting a crystallization of silicon;

forming a semiconductor film comprising silicon on said base film; and disposing said solution in contact with at least a portion of said semiconductor film;

heating said semiconductor film in order to crystalize said semiconductor film to a degree of crystallization in the range of 20 to 90%; and irradiating said semiconductor film with light after said heating in order to further crystallize said semiconductor film.

16. The method of claim 15 wherein said catalyst comprises a metal or a metal compound.

17. The method of claim 15 wherein a catalyst layer is formed by applying said solution containing said catalyst.

18. The method of claim 15 wherein said degree of crystallization is a proportion of area of a part crystallized of said semiconductor film with respect to an entire area of said semiconductor film.

19. A method of manufacturing a semiconductor device over a substrate comprising the steps of:

forming a base insulating film on said substrate;

forming a semiconductor film comprising silicon on said base insulating film in direct contact therewith;

disposing a catalyst capable of promoting a crystallization of an amorphous silicon on at least a portion of said semiconductor film;

heating said semiconductor film in order to crystallize said semiconductor film to a degree of crystallization of 97% or less; and then irradiating said semiconductor film with light in order to further improve the crystallinity of said semiconductor film.

20. The method of claim 19 wherein said base insulating film comprises silicon nitride.

21. The method of claim 19 wherein said degree of crystallization is a proportion of area of a part crystallized of said semiconductor film with respect to an entire area of said semiconductor film.

22. A method of manufacturing a semiconductor device comprising the steps of:

preparing a substrate having an insulating surface;

forming an amorphous semiconductor film comprising silicon on said insulating surface;

preparing a solution containing a catalyst therein which is capable of promoting a crystallization of said semiconductor film;

applying said solution on at least a portion of said semiconductor film;

forming a cover film on said semiconductor film after applying said solution on the semiconductor film; then applying a heat energy to said semiconductor film in order to crystallize said semiconductor film to a degree of crystallization of 97% or less, and irradiating said semiconductor film with light in order to further improve the crystallinity of said semiconductor film.

23. The method of claim 22 wherein said cover film comprises silicon nitride.

24. The method of claim 22 wherein said degree of crystallization is a proportion of area of a part crystallized of said semiconductor film with respect to an entire area of said semiconductor film.

25. A method of manufacturing a semiconductor device over a substrate comprising the steps of:

preparing said substrate having an insulating surface;

forming a base film comprising silicon nitride on said insulating surface;

preparing a solution containing catalyst capable of promoting a crystallization of silicon;

forming a semiconductor film comprising silicon on said base film; and disposing said solution in contact with at least a portion of said semiconductor film;

heating said semiconductor film in order to crystallize said semiconductor film to a degree of crystallization of 97% or less; and irradiating said semiconductor film with light after said heating in order to further crystallize said semiconductor film.

26. The method of claim 25 wherein said degree of crystallization is a proportion of area of a part crystallized of said semiconductor film with respect to an entire area of said semiconductor film.

* * * * *